US012678787B2

(12) United States Patent　　(10) Patent No.: US 12,678,787 B2
Dority　　(45) Date of Patent: Jul. 14, 2026

(54) DIAGNOSTIC DETECTION CHIP DEVICES AND METHODS OF MANUFACTURE AND ASSEMBLY

(71) Applicant: Cepheid, Sunnyvale, CA (US)

(72) Inventor: Douglas B. Dority, Santa Cruz, CA (US)

(73) Assignee: Cepheid, Sunnyvale, CA (US)

(*) Notice: Subject to any disclaimer, the term of this patent is extended or adjusted under 35 U.S.C. 154(b) by 97 days.

(21) Appl. No.: 18/185,754

(22) Filed: Mar. 17, 2023

(65) Prior Publication Data

US 2023/0330666 A1　　Oct. 19, 2023

Related U.S. Application Data

(62) Division of application No. 16/713,455, filed on Dec. 13, 2019, now Pat. No. 11,628,435.
(Continued)

(51) Int. Cl.
*B01L 3/00*　　　(2006.01)
*G01N 35/10*　　(2006.01)
*H10P 74/00*　　(2026.01)

(52) U.S. Cl.
CPC .... *B01L 3/502715* (2013.01); *G01N 35/1097* (2013.01); *H10P 74/27* (2026.01); *B01L 2200/026* (2013.01); *B01L 2300/0809* (2013.01)

(58) Field of Classification Search
CPC ......... B01L 3/502715; B01L 2200/026; B01L 2300/0809; B01L 7/52; B01L 2200/027; B01L 2200/028; B01L 9/52; B01L 2300/0645; B01L 2300/0816; B01L 2300/0877; B01L 3/502707; B01L 2300/0887; B01L 2300/1805; G01N 35/1097; G01N 35/00069; G01N 35/00029; G01N 2035/00039; H01L 22/30; H10P 74/27
(Continued)

(56) References Cited

U.S. PATENT DOCUMENTS 5,922,591 A　　7/1999　Anderson et al.
6,220,870 B1　　4/2001　Barabi et al.
(Continued)

FOREIGN PATENT DOCUMENTS

CN　　1440454 A　　9/2003
CN　　1461350 A　　12/2003
(Continued)

OTHER PUBLICATIONS

Wentworth et al, IEEE Transactions on Components, Hybrids, and Manufacturing Technolooy, vol. 12. No. 3. Sep. 1989. (Year: 1989).*
(Continued)

*Primary Examiner* — Christine T Mui
(74) *Attorney, Agent, or Firm* — Merchant & Gould P.C.

(57) ABSTRACT

Diagnostic detection chip device designs that reduce cost of fabrication and assembly are described herein. Such chip device designs include features that facilitate use of the chip within a chip carrier device with integrated fluid flow control features and compatibility with conventional sample cartridges and sample processing systems. Associated methods of manufacture and assembly of the chip devices are also provided herein.

11 Claims, 10 Drawing Sheets

Flex PCB mounted and wire bonded

Wire bond protection added

Related U.S. Application Data

(60) Provisional application No. 62/780,126, filed on Dec. 14, 2018.

(58) Field of Classification Search
USPC ......................................................... 436/63
See application file for complete search history.

(56) References Cited

U.S. PATENT DOCUMENTS

| | | | |
|---|---|---|---|
| 6,374,684 | B1 | 4/2002 | Dority |
| 6,818,185 | B1 | 11/2004 | Peterson et al. |
| 7,745,203 | B2 | 6/2010 | Hongo et al. |
| 11,628,435 | B2 | 4/2023 | Dority |
| 2003/0162304 | A1 | 8/2003 | Dority |
| 2004/0132059 | A1 | 7/2004 | Scurati |
| 2005/0158787 | A1 | 7/2005 | Hongo et al. |
| 2011/0229375 | A1 | 9/2011 | Ehrenpfordt |
| 2012/0061239 | A1 | 3/2012 | Elibol et al. |
| 2015/0004132 | A1 | 1/2015 | Robinson |
| 2015/0041324 | A1 | 2/2015 | Jeon |
| 2015/0202626 | A1 | 7/2015 | Huang |
| 2017/0021356 | A1 | 1/2017 | Dority |
| 2017/0023281 | A1 | 1/2017 | Fromm |
| 2018/0031592 | A1 | 2/2018 | Dority |

FOREIGN PATENT DOCUMENTS

| | | | |
|---|---|---|---|
| CN | 1596369 | A | 3/2005 |
| CN | 101802164 | A | 8/2010 |
| CN | 101914803 | A | 12/2010 |
| CN | 103616426 | A | 3/2014 |
| CN | 104549591 | A | 4/2015 |
| CN | 105745540 | A | 7/2016 |
| CN | 107003234 | A | 8/2017 |
| CN | 107739706 | A | 2/2018 |
| EP | 1542000 | A1 | 6/2005 |
| KR | 20080103232 | A | 11/2008 |
| KR | 102186259 | A | 3/2020 |
| WO | 2014/028378 | A2 | 2/2014 |
| WO | 2015/183871 | A1 | 12/2015 |
| WO | 2016/161385 | A1 | 10/2016 |

OTHER PUBLICATIONS

Alveringh, et al. "Universal modular fluidic and electronic interfacing platform for microfluidic devices." In Proceedings of the 3rd Conference on MicroFluidic Handling Systems (MFHS 2017), pp. 106-109. 2017.

Benavides, et al., National Technology and Engineering Solutions of Sandia LLC, 2002.

Geidel et al . . . Integration of an optical ring resonator biosensor into a self-contained microfluidic cartridge with active, single-shot micropumps. Micromachines. Sep. 13, 2016;7(9):153.

European Patent Office, Communication re Rule 164(2)(b) and Article 94(3) for Application No. 19839003.1 dated Feb. 5, 2024, 10 pages.

International Searching Authority, International Search Report and Written Opinion for application No. PCT/US2019/066255 mailed on Jun. 29, 2020, 16 pages.

* cited by examiner

401 support 411  410  412  420

Die and PCB mounted to support

430

Wire Bonds to connect die and PCB 420  440  422  420

Bond protection added

400

450  422

Completed flow cell assembly

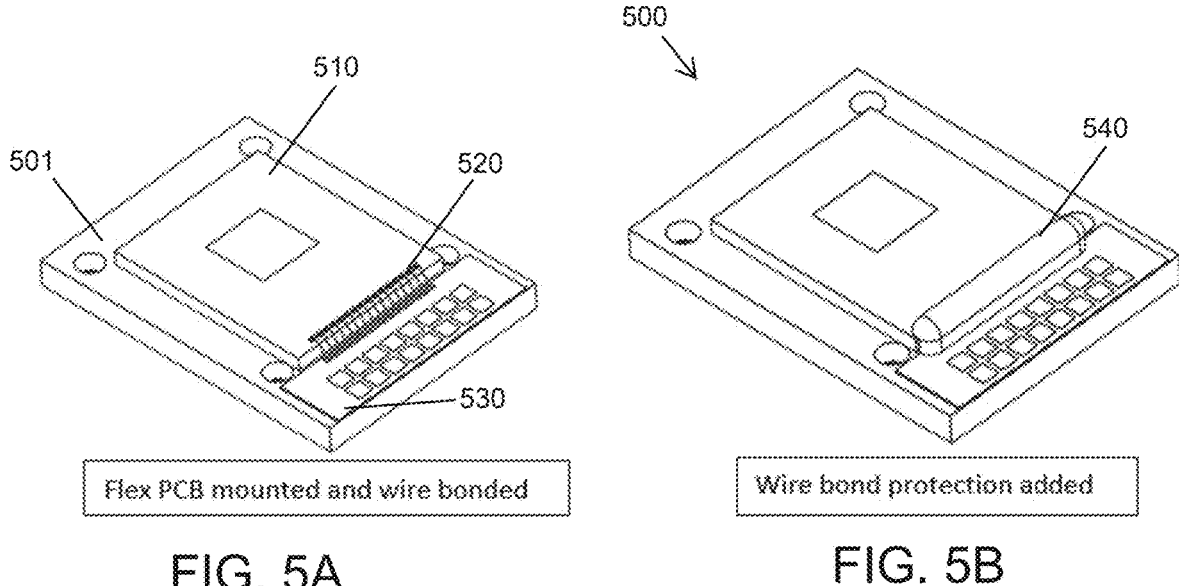
Flex PCB mounted and wire bonded
FIG. 5A
Wire bond protection added
FIG. 5B
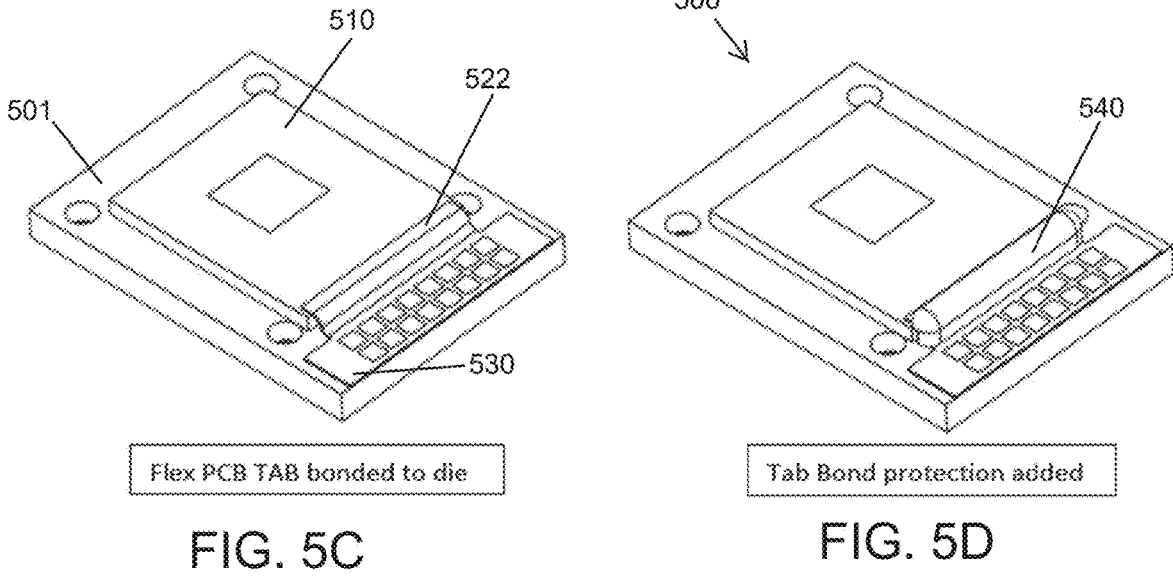
Flex PCB TAB bonded to die
FIG. 5C
Tab Bond protection added
FIG. 5D

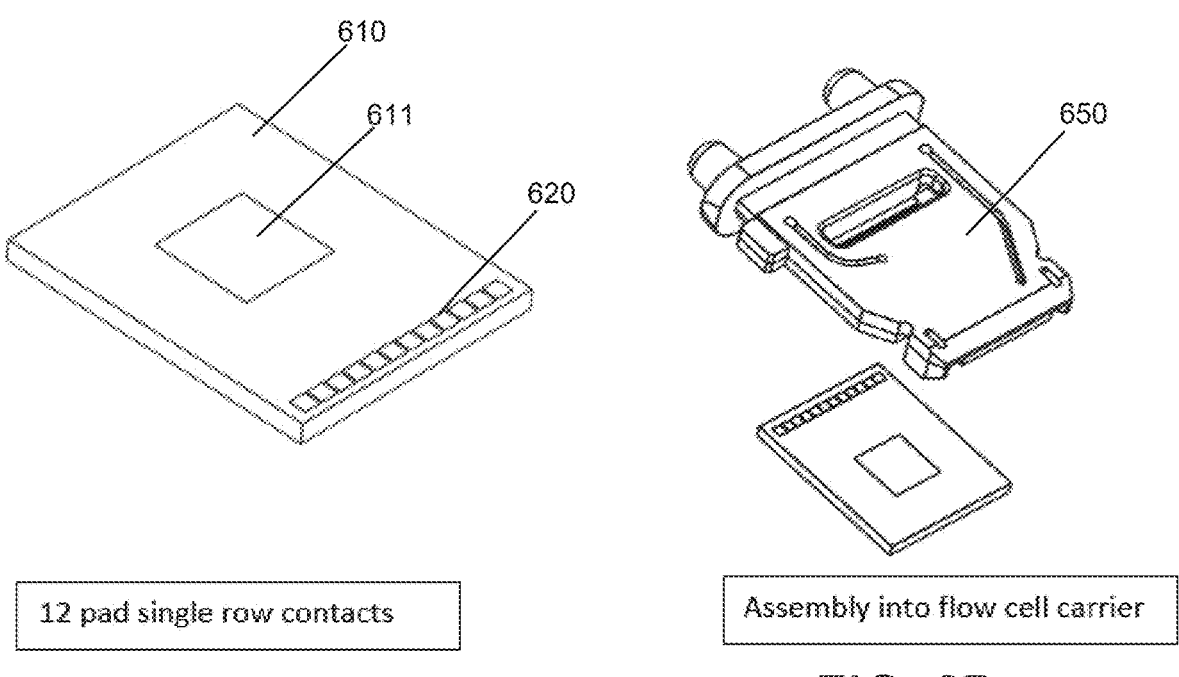
610
611
620
12 pad single row contacts
FIG. 6A
650
Assembly into flow cell carrier
FIG. 6B
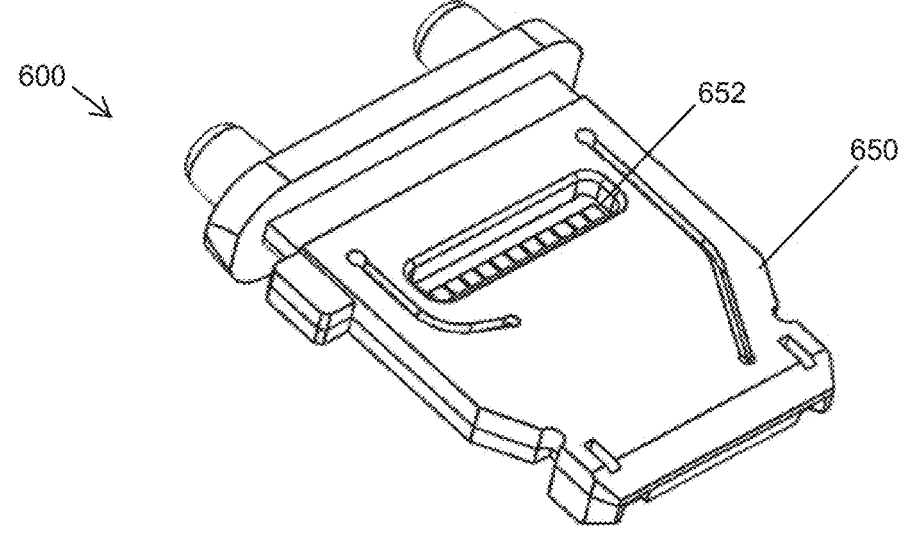
600
652
650
Completed flow cell assembly
FIG. 6C 16 pad dual row contacts Assembly into flow cell carrier Completed flow cell assembly

DIAGNOSTIC DETECTION CHIP DEVICES AND METHODS OF MANUFACTURE AND ASSEMBLY

CROSS-REFERENCES TO RELATED APPLICATIONS

This application is a Divisional of U.S. application Ser. No. 16/713,455, filed Dec. 13, 2019 which claims priority to U.S. Provisional Application No. 62/780,126 filed on Dec. 14, 2018, which is incorporated herein by reference in its entirety.

This application is generally related to U.S. application Ser. No. 16/577,650 entitled "System, Device and Methods of Sample Processing Using Semiconductor Detection Chips" filed on Sep. 20, 2019; U.S. application Ser. No. 15/718,840 entitled "Fluidic Bridge Device and Sample Processing Methods" filed Sep. 28, 2017; U.S. Pat. No. 6,374,684 entitled "Fluid Control and Processing System," filed Aug. 25, 2000; U.S. Pat. No. 8,048,386 entitled "Fluid Processing and Control," filed Feb. 25, 2002; and U.S. application Ser. No. 15/217,902 entitled "Thermal Control Device and Methods of Use" filed Jul. 22, 2016; each of which is incorporated herein by reference in its entirety for all purposes.

BACKGROUND OF THE INVENTION

The present invention relates generally to diagnostic detection chip devices and methods of manufacture and assembly. In particular, the invention pertains to semiconductor detection chip devices configured for use with a fluid sample transport device and sample processing system.

In recent years, there has been considerable development in the use of semiconductor detection chips in performing fluid sample analysis (e.g. testing of clinical, biological, or environmental samples). One continual challenge in conventional MEMs technologies in diagnostics has been the lack of flexible sample preparation front end to provide a fluid sample suitable for analysis with the semiconductor chips. Sample preparation of such fluid samples typically involves a series of processing steps, which can include chemical, optical, electrical, mechanical, thermal, or acoustical processing of the fluid samples. Whether incorporated into a bench-top instrument, a portable analyzer, a disposable cartridge, or a combination thereof, such processing typically involves complex fluidic assemblies and processing algorithms. Developing a robust fluid sample processing system can be extremely challenging and costly.

Conventional approaches for processing fluid samples typically involves substantial manual operation, while more recent approaches have sought to automate many of the processing steps and can include the use of sample cartridges that employ a series of regions or chambers each configured for subjecting the fluid sample to a specific processing step. As the fluid sample flows through the cartridge sequentially from region or chamber to a subsequent region or chamber of the cartridge, the fluid sample undergoes the processing steps according to a specific protocol. Such systems, however, generally include an integrated means of analysis, and are not typically amenable to use with a semiconductor chip. The standard approach of utilizing semiconductor detection chips, such as "lab on a chip" devices, generally requires a considerably complex, time-consuming and costly endeavor, requiring the chip be incorporated into a conventional chip package and then incorporated into much larger systems utilizing conventional fluidic transport means to transport a fluid sample to the chip device. The fluid sample is typically prepared by one or more entirely separate systems (often including manual interaction) and then pipetted into the fluid transport system to be supplied to the chip package. These challenges associated with pre and post testing processes often minimize the advantages and benefits of such "lab on a chip" devices and present a practical barrier to their widespread use and acceptance in diagnostic testing. Another drawback or limitation associated conventional approaches of MEMS diagnostics technology is cost. In order to make high functionality MEMS/silicon chip technologies feasible in the context of high volume diagnostic testing, the costs of the device should be as low as possible.

Thus, there is need for approaches that lower the costs of diagnostic chips and improve integration with flowcell components. There is further need for developing chip device that are compatible with existing sample processing technologies to allow for seamless integration with existing sample preparation technologies and to improve efficiency and throughput in fluid sample processing and handling to overcome the challenges described above.

BRIEF SUMMARY OF THE INVENTION

The present invention provides diagnostic detection chips and chip devices (also referred to as "chip," "detection chip," or "semiconductor chip") that facilitate use of the chip with sample processing devices and systems that transport processed fluid sample for analysis with the chip. Various approaches are provided that lower the costs of semiconductor detection chips and chip devices by improving integration of the semiconductor chip itself within the overall device. In one aspect, the device substantially reduces the size of a printed circuit board ("PCB") on which the semiconductor chip is provided, for example utilizing contacts in an electrical interface that is co-adjacent or on a same side as the active surface of the detection chip. It is appreciated that in some embodiments, the co-adjacent electrical interface may be configured to be probed from the same side, an opposite side or any direction desired, and that the co-adjacent electrical interface may include wire bonds or vias for electrical connection to the active surface. In some embodiments, this approach allows the PCB to be replaced with another type of substrate, for example a flexible substrate or laminate. In some embodiments, the electrical interface can be a flex PCB and utilize flex bonding or TAB (tape automated bonding). In other embodiments, a metal core board can be used as the chip substrate where a thermally conductive mount is desired. In still other embodiments, the substrate can be entirely eliminated and the electrical interface contact pads can be provided on the chip itself. It is appreciated that such a configuration could utilize probe contacts on a same side as the active surface or could be provided on an opposite side, for example by through-silicon-vias.

In another aspect, the invention pertains to chip devices compatible for use with chip carrier devices configured to utilize existing sample processing technologies to perform one or more processing steps, then transport the processed fluid sample to interface with the semiconductor chip and perform further processing with the chip. Such further processing typically includes analysis of a target analyte. In some embodiments, the invention further provides means for any of: powering a chip device, communicating, programming or signal processing when performing testing with a semiconductor detection chip device. In one aspect, the chip carrier device is configured for use with any of a plurality of differing types of chips and allows for a plug-n-play approach to utilizing semiconductor detection chips. In some embodiments, the chip carrier device is configured to receive and securely engage with a diagnostic chip having an active area, the chip device having a flowcell chamber that sealingly engages with the active area when secured within the chip carrier device.

It is appreciated that the chip device can include any type of semiconductor detection chip, including but not limited to CMOS, ion-sensitive FET (ISFET), bulk acoustic, non-bulk acoustic, piezo-acoustic, and pore array sensor chips. In some embodiments, the semiconductor detection chip serves as a biosensor that combines a biologically sensitive element with a physical or chemical transducer to selectively (and in some embodiments, quantitatively) detect the presence of specific analytes in a fluid sample. In some embodiments, the chip provides an electrical or optical output signal in response to a physical, chemical, or optical input signal. The system or module used with the chip carrier device can include features for powering, communication, signal integration, and data flow when performing testing with the detection chip and can include software to facilitate use of the chip within the system. In some embodiments, to enable additional new or enhanced functionality, one or more features that provide sample processing and/or sample preparation capabilities amenable to silicon-based technologies can be included on the silicon chip. For example, the chip could include one or more features for more refined fluidic manipulation, further refined sample processing, or any compatible sample processing and/or preparation steps. Such technologies and functionalities could include but are not limited to: electrophoretic-based separation; fluidic pumping; and electrowetting-based fluidic manipulation, including droplet generation or pumping, flow sensors, and the like. In some embodiments, the chip can be bio-functionalized. The chip can utilize bio-functionalized materials (e.g., nanosheets, nanotubes, nanoparticles), for example, as surfaces or coatings. In some embodiments, a surface is bio-functionalized to facilitate controlled movement or immobilization of a probe or target. It is appreciated that any of these chip features described above could be included in any of the embodiments described herein, and further that the chip carrier can be adapted for use with such chip features.

In some embodiments, the chip device is electrically coupled to a plurality of probe contact pads without any backside contacts by PCB via connections. This allows for a streamlined chip design in which the probe contacts are accessible from a same side of the chip as the active area. In some embodiments, the chip device includes a separate electrical interface having multiple probe contact pads, the separate electrical interface disposed adjacent the chip when carried within the chip carrier portion. In some embodiments, the electrical interface can be a PCB having an area less than the diagnostic chip. Advantageously, the electrical interface can be defined as flex PCB and the probe contacts of the electrical interface are electrically connected to corresponding contacts of the chip by TAB bonds. In some embodiments, the chip is provided on a support substrate comprising a flex PCB, polymer film or self-adhesive flex laminate. In other embodiments, the chip is defined without any support substrate separate (e.g. rigid PCB underlying the chip) from a semiconductor wafer in which the chip is defined. In such embodiments, the chip can include a plurality of probe contacts defined within the chip itself and the chip carrier portion can include a window through which the plurality of probe contacts are accessible when the chip is secured within the chip carrier portion and sealingly engaged with the flowcell chamber. In some embodiments, the chip includes a support substrate of a thermally conductive metal (e.g. copper).

In another aspect, the invention pertains to more cost-effective, streamlined diagnostic chip designs and methods of manufacture and assembly within the chip carrier device with integrated flowcell chamber. Such diagnostic detection chips can include a silicon wafer device comprising an active area configured for diagnostic detection of fluid sample in contact during operation and a plurality of contacts that are electrically connected to the active area for powering and communication with the active area. Advantageously, the plurality of contacts can be provided on a same side of the chip as the active area. This allows for a chip that is electrically connected without any backside via connections, thereby simplifying the chip design and process workflow. In some embodiments, the chip comprises a support structure of a self-adhesive flex laminate. The contacts can be electrically connected to a separate PCB having a plurality of probe contact pads on the same side as the active area. In some embodiments, the chip includes a support structure of a thermally conductive metal, such as copper, to facilitate thermal cycling. In other embodiments, the chip is without any support substrate separate from the silicon wafer in which the chip is defined. In such embodiments, the plurality of contacts can be defined as probe contact pads within the chip itself and disposed on the same side of the chip as the active area.

In yet another aspect, the invention pertains to a system that includes a sample cartridge configured to hold an unprepared sample, the sample cartridge having multiple processing chambers fluidically interconnected by a moveable valve body; a module (also referred to as a "cartridge processing module" or "module") for performing sample preparation, the module having a cartridge receiver adapted to receive and removably couple with the sample cartridge and configured to perform sample preparation; and a diagnostic chip device secured within a chip carrier device. The chip carrier device is fluidically coupleable to the sample cartridge via the fluidic interface and electrically coupleable with the module for powering and communication with a diagnostic detection chip secured within the chip device. The diagnostic chip device can be in accordance with any of those described herein.

In still another aspect, the invention pertains to methods of fabricating a diagnostic detection chip for use. Such methods can include defining a diagnostic chip having an active surface that is electrically connected to a plurality of electrical contacts accessible from a same side as the active surface. In some embodiments, the diagnostic chip is defined to electrically connect without backside contacts having vias through any underlying rigid support substrate (e.g. PCB). This allows for alternative support structures (e.g. flex PCB, laminates, metal or substrates of reduced size and thickness). In some embodiments, the chip device is configured to electrically connect the active surface to a plurality of probe contact pads without any wire bonds. In some embodiments, the chip device is designed entirely without any separate underlying support substrate (e.g. rigid PCB). In some embodiments, the probe contacts can be formed in the chip itself, either along the same side as the active surface or along the opposite side. Any of the chips described herein can comprise any of CMOS, ISFET, bulk acoustic, non-bulk acoustic, piezo-acoustic and pore array sensor chips.

BRIEF DESCRIPTION OF THE DRAWINGS

FIGS. 5A-5D illustrate methods of fabricating, assembling diagnostic chip devices, in accordance with some embodiments.

FIGS. 6A-6C illustrate methods of fabricating, assembling diagnostic chip devices, in accordance with some embodiments.

DETAILED DESCRIPTION OF THE INVENTION

Figure 1:
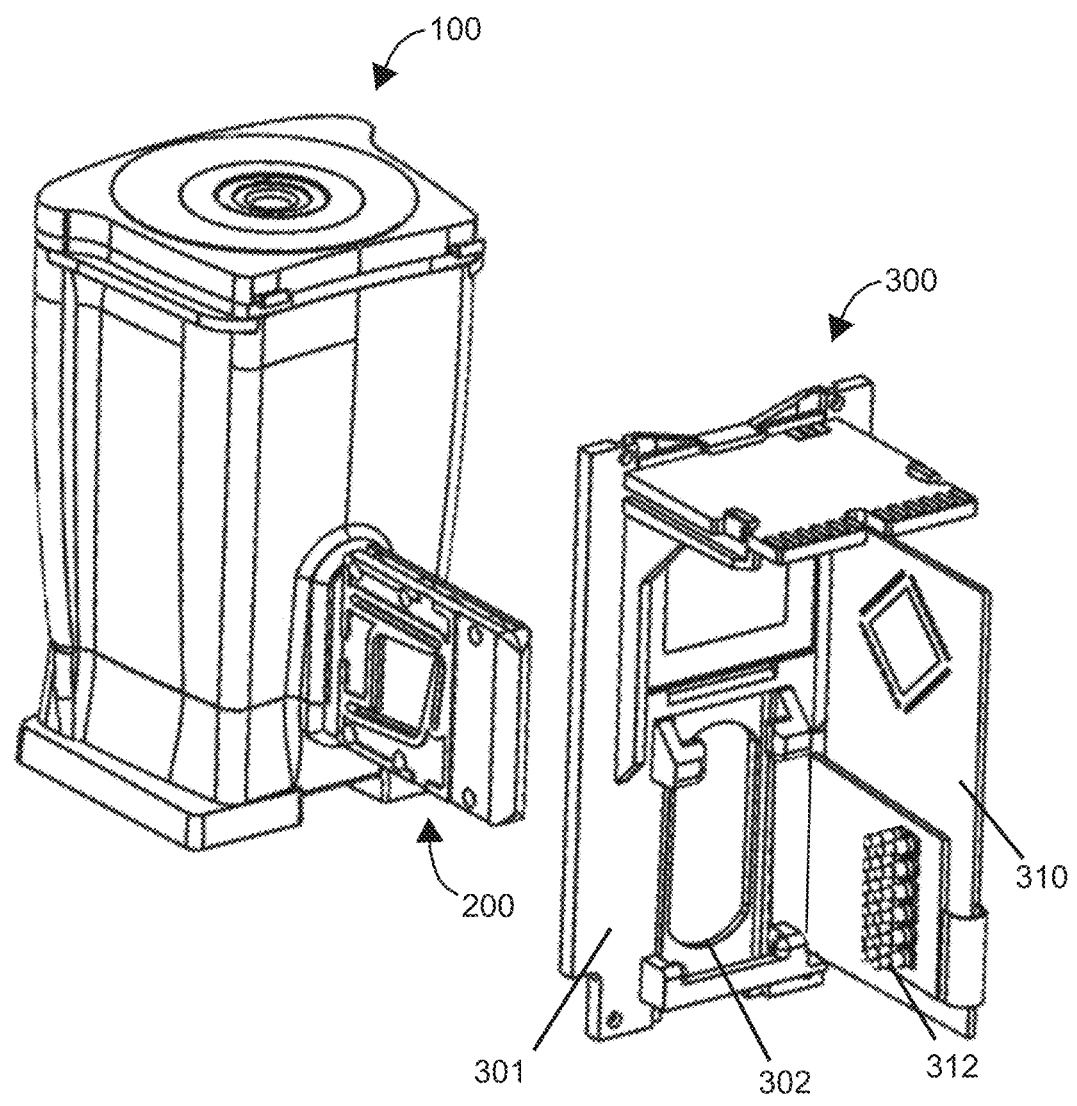
FIG. 1 is an overview of a sample cartridge fluidically coupled with a chip carrier device and an associated instrument interface board of a module for receiving and operating the sample cartridge in accordance with some embodiments of the invention.

The present invention relates generally to a system, device and methods for fluid sample manipulation and analysis, in particular, for transport of a fluid sample from a sample processing device into a chip carrier device for analysis using a semiconductor chip.

I. Overview

In one aspect, the invention pertains to an improved or streamlined chip design that reduces fabrication costs. In another aspect, the chip design improves integration with existing sample processing technologies by having features compatible with a chip carrier device. Such a chip carrier device includes fluid control features, such as one or more fluid conduits that are fluidly coupleable with one or more ports of a sample cartridge to facilitate transport of a processed fluid sample from the cartridge into the chip carrier device through the one or more fluid conduits to facilitate transport of the fluid sample to the semiconductor chip in the chip carrier device. The sample cartridge is received by a module which facilitates operation of the sample cartridge to perform processing and transport of the processed fluid sample into the chip carrier device and includes an instrument interface that electrically connects to the chip carrier device to facilitate operation of the semiconductor chip carried within the chip carrier device.
A. Chip As described herein, the term "chip" can refer to the chip itself or a chip device that includes the chip and an underlying support substrate and adjacent electrical interface that is electrically connected to the chip. Typically, the chip includes a silicon sensor element having an active face that is sealingly engaged with a flowcell filled with a prepared fluid sample. In some embodiments, the chip device is designed and configured to be carried within a chip carrier device having an integrated flowcell and fluid control features so as to be compatible for use with a sample processing module as described above. The chip device can be bonded within the recess of the chip carrier device or can be pressed into the recess and secured by a friction fit. The chip is provided to the user already secured within a chip carrier device, or an end user can assemble the chip within a chip carrier device.

In some embodiments, the semiconductor diagnostic chip is configured to perform sequencing of a nucleic acid target molecule by nanopore sequencing, which detects changes in electrical conductivity and does not require optical excitation or detection. The underlying technologies of such chips can be further understood by referring to U.S. Pat. No. 8,986,928. In some embodiments, the semiconductor diagnostic chip analyzes other attributes of a target molecule in the sample, such as molecular weight and similar characteristics. Such technologies can be further understood by referring to: Xiaoyun Ding, et al. *Surface acoustic wave microfluidics*. Lab Chip. 2013 Sep. 21; 13 (18): 3626-3649. In some embodiments, the semiconductor diagnostic chip uses surface plasmon resonance to provide analysis of a target molecule, for example as used in the Biocore™ systems provided by GE Healthcare UK Limited and as described in their Biocore Sensor System Handbook (see gelifesciences.com/biacore). The entire contents of each of the above references are incorporated herein by reference in their entirety.

Typically, the chip is a semiconductor diagnostic detection chip, including but not limited to CMOS, ISFET, bulk acoustic, non-bulk acoustic chips, piezo-acoustic, and pore array sensor chips. While semiconductor diagnostic chips are preferred, it is appreciated that the concepts described herein are applicable to any type of chip suitable for use in performing processing or analysis of a fluid sample.
B. Chip Carrier Device The chip carrier device is adapted to fluidically couple a semiconductor chip to a sample cartridge as described herein. In some embodiments, the chip carrier device includes an electrical interface adapted to interface with an instrument interface board of a sample processing module which operates the sample processing cartridge. It is appreciated that the chip carrier device can be configured for use with any type of chip. In some embodiments, the chip carrier device is designed to allow analysis of the biological fluid sample with the chip by electrical operation of the chip by the instrument interface of the module. This is accomplished through electrical probe contact pads of the chip device that are electrically connected to the instrument interface of the module.

A configuration as described above allows for a more seamless transition between processing of the fluid sample with the sample cartridge and subsequent processing or analysis of the fluid sample with the chip in the chip carrier device. This configuration facilitates industry development of semiconductor chip devices by standardizing processing or preparation of the sample and delivery of the processed sample to the chip device. Preparation of the sample can be a time consuming and laborious process to perform by hand and can be challenging to develop within a next generation chip device. By utilizing a chip carrier device instead of the reaction tube, the user can utilize the sample cartridge to prepare the sample in a sample cartridge and subsequently transport the prepared sample into the attached chip carrier device for analysis with the semiconductor chip device carried therein. Such a configuration expedites development of semiconductor chip by utilizing existing sample preparation processes, originally configured for PCR detection, and allowing use of such processes with a chip device.

In some embodiments, the chip carrier device can include one or more processing features in fluid communication with one or more of the fluid flow channels, such as one or more chambers, filters, traps, membranes, ports and windows, to allow additional processing steps during transport of the fluid sample to the second sample processing device. Such chambers can be configured for use with an amplification chamber to perform nucleic acid amplification, filtration, chromatography, hybridization, incubation, chemical treatment, e.g., bisulfite treatment and the like. In some embodiments, the chamber allows for accumulation of a substantial portion of the fluid sample, if not the entire fluid sample, for further processing or analysis as needed for a particular protocol.

C. Sample Cartridge

The sample cartridge can be any device configured to perform one or more process steps relating to preparation and/or analysis of a biological fluid sample according to any of the methods described herein. In some embodiments, the sample cartridge is configured to perform at least sample preparation. The sample cartridge can further be configured to perform additional processes, such as detection of a target nucleic acid in a nucleic acid amplification test (NAAT), e.g., Polymerase Chain Reaction (PCR) assay, by use of a reaction tube attached to the sample cartridge. Preparation of a fluid sample generally involves a series of processing steps, which can include chemical, electrical, mechanical, thermal, optical or acoustical processing steps according to a specific protocol. Such steps can be used to perform various sample preparation functions, such as cell capture, cell lysis, binding of analyte, and binding of unwanted material.

A sample cartridge suitable for use with the invention, includes one or more transfer ports through which the prepared fluid sample can be transported into a reaction tube for analysis. FIG. 1 illustrates an exemplary sample cartridge 100 suitable for use with a chip carrier device 200 in accordance with some embodiments. Conventionally, such a sample cartridge is associated with a planar reaction tube adapted for analysis of a fluid sample processed within the sample cartridge 100. Such a sample cartridge 100 includes various components including a main housing having one or more chambers for processing of the fluid sample, which typically include sample preparation before analysis. In accordance with its conventional use, after the sample cartridge 100 and reaction tube are assembled and a biological fluid sample is deposited within a chamber of the sample cartridge, the cartridge is inserted into a cartridge processing module configured for sample preparation and analysis. The cartridge processing module then facilitates the processing steps needed to perform sample preparation and the prepared sample is transported through one of a pair of transfer ports into the fluid conduit of the reaction tube 110 attached to the housing of the sample cartridge 100. The prepared biological fluid sample is then transported into a chamber of the reaction tube 110 through a fluidic interface of the reaction tube where the biological fluid sample undergo nucleic acid amplification and testing to indicate the presence or absence of a target nucleic acid analyte of interest, e.g., a bacteria, a virus, a pathogen, a toxin, or other target analyte, for example by use of an excitation and optical detection means. Such a sample cartridge can also be utilized to perform analysis with the semiconductor chips described herein by use of a chip carrier device, which is fluidically coupleable to the sample cartridge in the same or similar manner as a conventional reaction tube.

An exemplary use of a sample cartridge with a planar reaction tube configured for controlled fluid control of a prepared fluid sample is described in commonly assigned U.S. Pat. No. 6,818,185, entitled "Cartridge for Conducting a Chemical Reaction," filed May 30, 2000, the entire contents of which are incorporated herein by reference for all purposes. Examples of the sample cartridge and associated module are also shown and described in U.S. Pat. No. 6,374,684, entitled "Fluid Control and Processing System" filed Aug. 25, 2000, and U.S. Pat. No. 8,048,386, entitled "Fluid Processing and Control," filed Feb. 25, 2002, the entire contents of which are incorporated herein by reference in their entirety for all purposes.

Figure 3:
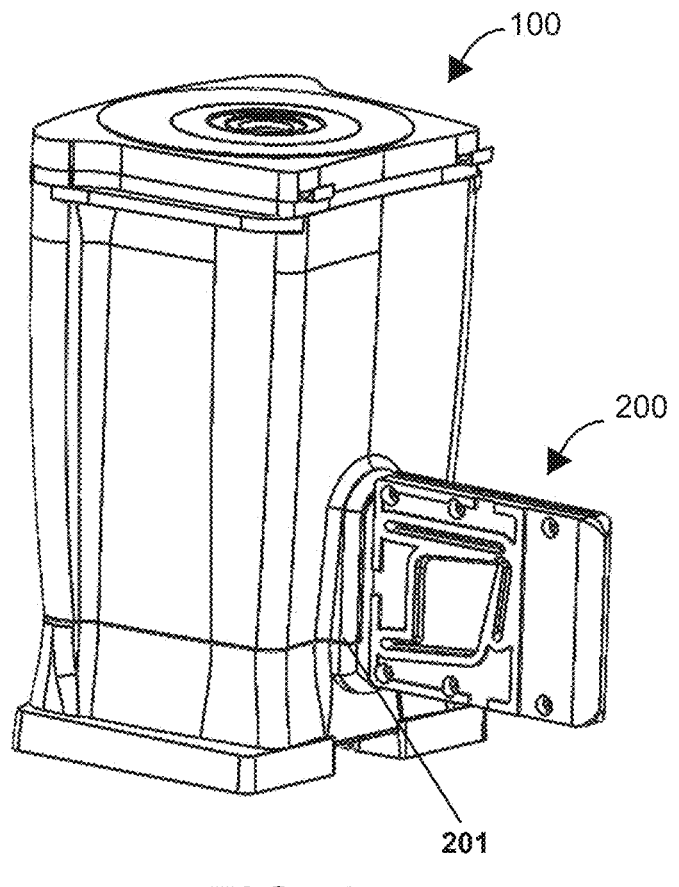
FIG. 3 illustrates a detailed view of the sample cartridge fluidically coupled with a chip carrier device, in accordance with some embodiments.

Various aspects of the sample cartridge 100 shown in FIG. 3 can be further understood by referring to U.S. Pat. No. 6,374,684, which described certain aspects of the sample cartridge in greater detail. Such sample cartridges can include a fluid control mechanism, such as a rotary fluid control valve, that is connected to the chambers of the sample cartridge. Rotation of the rotary fluid control valve permits fluidic communication between chambers and the valve so as to control flow of a biological fluid sample deposited in the cartridge into different chambers in which various reagents can be provided according to a particular protocol as needed to prepare the biological fluid sample for analysis. To operate the rotary valve, the cartridge processing module comprises a motor such as a stepper motor that is typically coupled to a drive train that engages with a feature of the valve in the sample cartridge to control movement of the valve and resulting movement of the fluid sample according to the desired sample preparation protocol. Fluid metering and distribution functions of the rotary valve can be utilized and controlled to perform a particular sample preparation protocol.

It is appreciated that the sample cartridge described above is but one example of a sample processing device suitable for use with the chip carrier devices in accordance with embodiments described herein. While chip carrier configurations that allow for use of such a sample cartridge are particularly advantageous as they allow utilization of existing sample cartridges and sample processing devices, it is appreciated that the concepts described herein in regard to the chip design can be applied to other sample processing devices, for example, the dual piston rotary valve device described in U.S. Pat. No. 7,032,605, incorporated herein by reference. It is further appreciated that the chip designs described herein can be configured to be compatible with various other chip carrier devices, sample cartridge configurations or other fluid sample processing devices and components, for example, any of those described in U.S. Provisional Application No. 62/734,079 filed Sep. 20, 2018, incorporated herein by reference.

D. Instrument Interface

In another aspect, the module includes an instrument interface to facilitate powering and communication with the chip. The instrument interface can include a circuit board adapted to engage an electrical interface of the chip device to allow the module to electrically power, control and communicate with the chip device. In some embodiments, the instrument interface is located within a common housing of the module to provide more seamless processing between the sample cartridge and the chip device. The instrument interface can be controlled by the module in coordination with transport of the fluid sample from the sample cartridge to the chip.

In some embodiments, the instrument interface board includes probe contacts and is mechanically mounted on a pivot that moves toward the chip carrier device when received within the module. The instrument interface board is configured to pivot from an open position before the sample cartridge is loaded to an engaged position when loaded. A cam (not shown) positions the interface board so that the probes contact the electrical interface of the chip device. The probe contacts are typically pogo pins on the instrument interface board that contact corresponding probe contact pads on the electrical interface of the chip device to allow the module to control analysis of the fluid sample with the chip.

The instrument interface board can also host passive and active electronic components in addition to those of the chip carrier as needed for various other tasks. For example, such components could include any components needed for signal integrity, amplification, multiplexing or other such tasks.

E. Example Systems

FIG. 1 illustrates an overview of a system utilizing a conventional sample cartridge 100 fluidically coupled with a chip carrier device 200. The sample cartridge 100 is adapted for insertion into a bay of a sample processing module configured to perform one or more processing steps on a fluid sample contained within the sample cartridge through manipulation of the sample cartridge. An instrument interface 300 of the module is incorporated into the module within the bay in which sample cartridge 100 is received and includes a plate 301 having a receptacle opening 302 through which the chip carrier device 200 extends when cartridge 100 is positioned within the bay. The instrument interface 300 further includes an instrument board 310, such as a PCB board, that extends alongside a major planar surface of chip carrier device 200 and includes electrical contacts 312 arranged so as to electrically couple with corresponding probe contact pads on the major planar surface of the chip device.

Figure 2A:
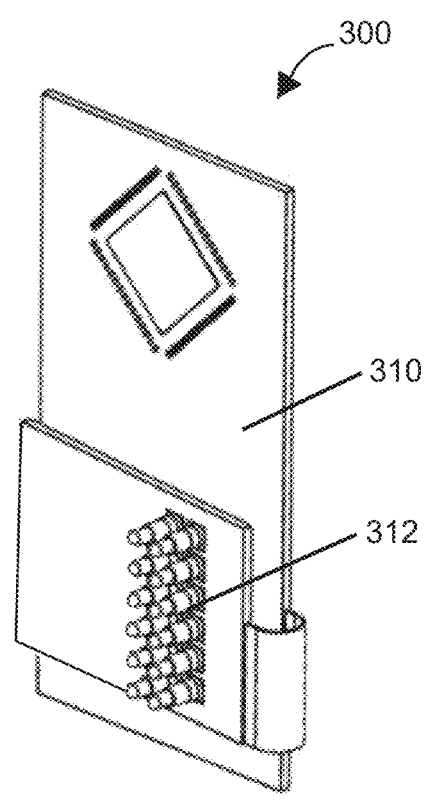
FIG. 2A illustrates the instrument interface board of the module, the instrument interface board having an array of electrical contacts for interfacing with electrical contact pads of the chip device when the sample cartridge is received within the module, as shown in FIG. 2B, in accordance with some embodiments.
Figure 2B:
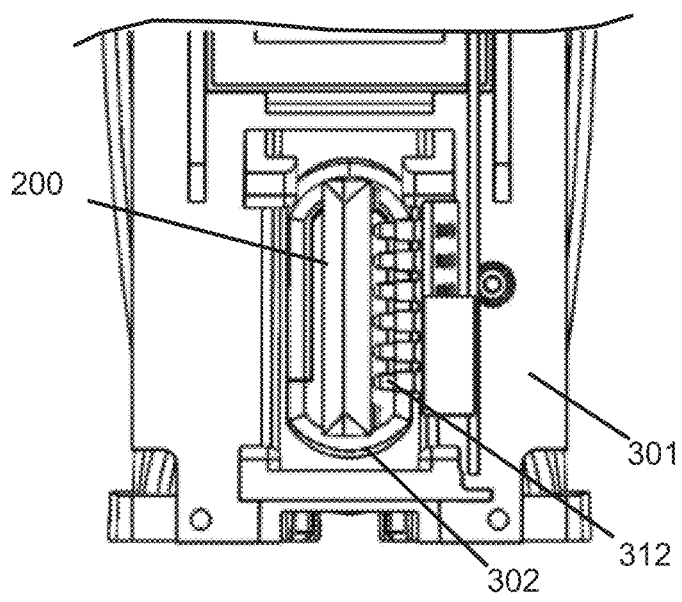

FIG. 2A illustrates the instrument interface board 310 of the module and the electrical contacts 312 for interfacing with electrical contact pads of the chip device. Typically, the contacts 312 are arranged in a pattern, such as a rectangular array, that corresponds to the contacts of the chip device. In this embodiment, the contacts 312 are configured as pogo-pins so as to deflect upon insertion of the chip carrier device 200 through receptacle opening 302 to provide secure electrical coupling between probe contacts 312 and corresponding probe contact pads on the instrument interface of the chip device secured within the chip carrier device 200, as shown in FIG. 2B. Although a rectangular array of pogo-pins is depicted here, it is appreciated that the electrical contacts could be arranged in various other patterns, in accordance with a corresponding chip carrier device and that various other contact constructions could be realized. In some embodiments, the electrical contacts could be configured as one or more edge connectors or other types of multi-pin connector arrangements. It is further appreciated that the instrument interface need not utilize every contact so as to be compatible for use with a chip carrier device having differing numbers or arrangements of contact pads, as desired. In some embodiments, the electrical contacts could include an additional adapter so as to be suitable for use with various differing types of chip carrier devices. In some embodiments, it may be cost effective to package a semiconductor controller as an adjunct to the chip carrier device such that the signal connectivity is minimized. Such an approach could use any suitable connector means, which can include a standard connector type, such as a USB interface (e.g. [+1, −2, sig 3, sig 4]).

Figure 9A:
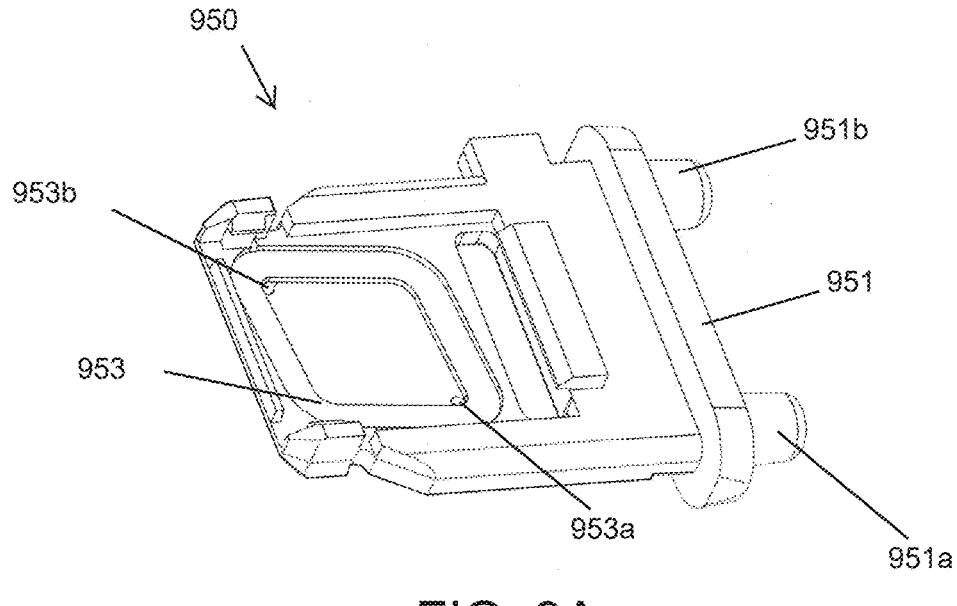
FIGS. 9A-9C illustrate an integrated diagnostic chip and chip device, in accordance with some embodiments.

FIG. 3 illustrates a detailed view of the sample cartridge 100 fluidically coupled with chip carrier device 200 with integrated fluid flow control, in accordance with some embodiments. Typically, the chip carrier device 200 is a planar device that includes a flowcell chamber for engaging against the active area of the chip and a fluidic interface 201 that fluidically couples to a fluid sample container, such as sample cartridge 100. In this embodiment, the fluidic interface 201 fluidically couples to the sample cartridge 100 and includes a pair of fluid ports (not visible) that couple with corresponding fluid ports of the sample cartridge. On one side of the planar device is the flowcell chamber, for example, as shown in FIG. 9A. The other side of the planar device can include one or more fluid control features, such as an amplification chamber. The chip carrier device can be formed from a suitably rigid material such that the chip carrier device 200 extends outward from the sample cartridge 100, which allows clearance for various other components, such as the instrument interface board of the module and/or thermal cycling units.

The chip carrier device 200 includes a fluidic interface 201 that can be configured with fluid ports (e.g. Luer type ports) and flange arrangement that is the same or similar as that of a typical PCR reaction tube so that the fluid sample adapter can easily interface with existing sample cartridges, as described previously. It is appreciated however that various other types of fluid ports (e.g. Luer type ports, pressure fit, friction fit, snap-fit, click-fit, screw-type connectors, etc.) in various other arrangements could be used. Typically, the fluidic pathways are defined in a first substrate and sealed by a second substrate, such as a thin film, similar to the construction of conventional PCR reaction tubes. In some embodiments, the fluid sample adapter also features alignment and assembly bosses as well as mechanical snaps so that a chip carrier component or chip can be secured against a flowcell of the flowcell portion with ease. In some embodiments, the chip carrier device includes one or more channels that extend between fluid-tight couplings without any chambers, valves or ports between the proximal and distal ends. In other embodiments, the device includes one or more valves, or ports. In some embodiments, the one or more channels can include one or more chambers or regions, which can be used to process or analyze the fluidic sample, for example, chambers or regions for thermal amplification of a nucleic acid target, filtration of the sample, chromatographic separation of the sample, hybridization, and/or incubation of the sample with one or more assay reagents.

As can be seen in the example of FIG. 9A, the fluidic path leads to a flowcell chamber 953 through set of flowcell ports 953a, 953b within the flowcell. In this embodiment, the flowcell chamber 953 includes an inlet flowcell port 953a and outlet flowcell port 953b, which allow for controlled fluid transport through the fluid sample adapter 951 into the flowcell chamber 953 via the fluidic inlet 951a and fluidic outlet 951b. Typically, the flowcell inlet 953a is disposed below the flowcell outlet 953b when the fluid sample adapter 201 is oriented vertically to facilitate controlled fluid flow through the flowcell chamber 953. It should be understood that use of the terms "inlet" and "outlet" do not limit function of any fluid inlets or outlets described herein. Fluid can be introduced and evacuated from both or either. It is appreciated that the chip carrier device can be formed as an integral component or assembled from multiple components, and can incorporate various other features (e.g. valve, filter).

In some embodiments, the chip carrier device (or at least a partial assembly) is provided pre-attached to a sample cartridge with the fluid-tight couplings coupled with corresponding fluid ports of the cartridge. For example, a sample cartridge may be provided already coupled with the fluid sample adapter 201 such that an end-user can insert any chip within the chip carrier device 200 against the flowcell chamber to facilitate sample detection with a chip.

The flowcell portion of the chip carrier device is configured with an open chamber that, when interfaced with an active area of a chip within the chip carrier, forms an enclosed flowcell chamber to facilitate analysis of the fluid sample with the chip. The flowcell is shaped and configured to fluidly couple with a chip within a chip carrier attached to the fluid sample adapter 201. Typically, the fluidic pathway of the fluid flow portion fluidically connects to the flowcell chamber through fluid ports located at the top and bottom of the flowcell chamber. The chamber is formed by raised lands or ridges that come in contact with the active silicon or glass element used in the detection scheme. The active element is located on the chip carried within the chip carrier and secured to the flowcell by bonding and sealing, which can be accomplished by various means (e.g. using epoxy preforms, dispensed epoxy or other adhesives, a gasket, a gasket with adhesive, mechanical features, or various other means). The purpose of the flowcell adapter is to create a complete flowcell chamber, bounded by the detection surface on one side and the flowcell adapter on the remaining sides. The flowcell can include one or more coupling features defined as alignment and assembly bosses as well as mechanical snaps that are received in corresponding holes to facilitate alignment of the chip when secured within.

The chip carrier device can include a contoured region dimensioned to receive the chip within. The contoured region includes a raised ridge along the perimeter thereof to engage a corresponding portion of the flowcell portion and effectively seal the chip within the chip carrier device. The raised lands or ridge around the open flowcell chamber engage an active surface of the chip so as to form an enclosed flowcell chamber. The chip carrier can include a window to provide access to the plurality of probe contacts defined on the chip itself or on an electrical interface of the chip device. Alternatively, the chip carrier device can be dimensioned so that the electrical interface of the chip or chip device extend beyond the distal end of the chip carrier device so as to be accessible by the instrument interface of the module.

It is appreciated that the chip carrier device with integrated fluid control can include any of the feature or structures described herein, or any of those described in U.S. Provisional Application No. 62/734,079 filed Sep. 20, 2018.

II. Diagnostic Chip Devices and Assemblies

In one aspect, integrated diagnostic chip designs are described that further simplifies the fundamental design of the chip device, thereby reducing manufacturing costs and allowing for further integration and simplification of the chip device.

Embodiments previously described in U.S. Provisional Application No. 62/734,079 assume use of a chip design fabricated according to conventional techniques. The current low cost state of the art is to use chip on board (COB) strategies to eliminate separate semiconductor packaging elements. Generally, COB techniques rely on a PCB substrate to which the chip is mounted and perform wire bonding operations and subsequent bond protection operations on the device. The PCB serves the purpose of creating a mounting surface for the chip and utilizes vias on the PCB to electrically connect the chip to connection points (e.g. probe contact pads) disposed on the side opposite the chip. This approach allows a large number of contact pads to be distributed over the relatively large surface area on the opposite side of the chip. Use of a separate PCB in this manner aids the semiconductor processing workflow and is the widely accepted, most common approach. One significant drawback with this approach is that it is fairly expensive, requiring additional materials within the PCB (often costing as much as the chip itself) and incurs further expenses within the workflow steps needed to clean and mount the chip on the PCB. Therefore, the invention described herein provides alternative, integrated approaches to designing and fabricating a diagnostic chip to facilitate use within a chip carrier device and take advantage of existing sample preparation techniques while further reducing the fabrication and workflow costs of the chip. These approaches are advantageous over conventional COB techniques and allow for the further simplification without any modification or only slight modification in chip design.

There are several different approaches proposed for streamlining diagnostic chip design for use with the sample processing systems and methods described herein. These approaches include: (i) utilizing probe contacts on a separate PCB adjacent the chip, which allows for additional alternative approaches including: (ii) given the reduced size/thickness requirements of any PCB or support substrate of the diagnostic chip, replacing the PCB with a less expensive support substrate (e.g. thinner, lighter, more flexible, etc.) (iii) utilizing flex PCB and tab bonding techniques; (iv) using a metal core board to support the chip as a thermally conductive mount; (v) eliminating the substrate entirely and forming probe contact pads in the chip itself. These different approaches are described in further detail in FIGS. 23A-26C below.

A. Probe Contacts on Separate PCB

In a first aspect, the streamlined chip design entails substantially reducing the size of the PCB and moving the PCB alongside of the chip device (e.g. semiconductor/MEMs) and performing the wire bonding/wire bonding protection in the areas of co-adjacency of the components. In this approach, the diagnostic chip is designed to electrically connect with probe contacts provided on a separate PCB board. This allows the PCB board or substrate of the chip to be reduced in size and further allows the probe contacts to be probed from the same side as the chip. In some embodiments, this approach mounts both the PCB and device onto a separate surface, typically during the same pick and place operation of the semiconductor packaging work flow. This allows the mounting substrate to be very inexpensive, such as plastics and composites, and also opens the possibility of using thermally conductive metals or ceramics as the supporting substrate. This strategy generally prefers that the connections to the completed device be made from the same side as the devices. In some embodiments, this concept could be used and configured such that the probe contacts still face in the opposite direction. The main cost reduction is the size of the PCBs and the flexibility given to the process by allowing different PCBs and chip devices to be matched without significant redesigns. FIGS. 4A-4E illustrates sequential steps of assembling a chip device assembly 400 utilizing a chip having associated probe contact pads provided on a separate PCB, as described above.

Figures 4A, 4B, 4C, 4D, 4E:
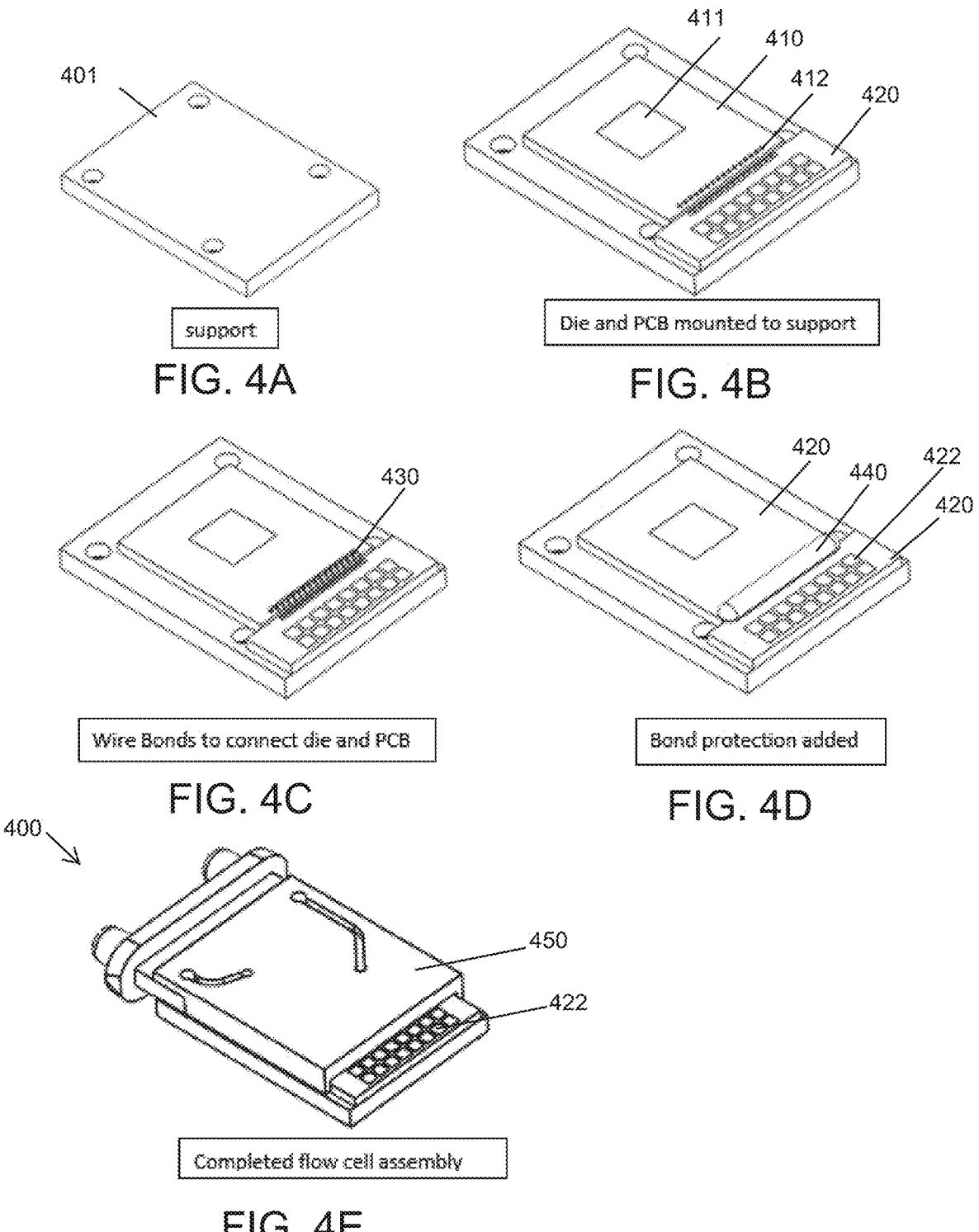
FIGS. 4A-4E illustrate methods of fabricating, assembling diagnostic chip devices, in accordance with some embodiments.

FIG. 4A shows a support substrate 401, which can be smaller and thinner than would be customarily used if the probe contacts on a backside of the PCB by via connections. FIG. 4B illustrates a diagnostic chip 410 that is die cut and mounted on the substrate 400 with an active area 411 facing upwards and having an array of electrical contacts 412. In some existing chip designs, this array of contacts is considerably smaller than probe contact pads and are used for testing purposes during chip manufacturing. Adjacent the chip 410 is a PCB 420, having an area smaller than the chip area and having probe contact pads disposed on the same side as the chip. FIG. 4C shows the electrical contact array connected to the probe contacts 422 of PCB 420 by wire bonds 430. FIG. 4D shows the addition of bond protection 440 (e.g. layer of epoxy). FIG. 4E shows the assembly secured within chip device 450 having an integrated flowcell engaged with active area 411. As can be seen, the probe contact pads 422 remain accessible to be probed by an electrical interface within a sample processing module in which the device 450 is inserted, as described in previous embodiments.

B. Alternative Chip Substrates/Connection Types

Given that the probe contact pads are provided on a separate PCB, the support substrate of the chip can not only be smaller and thinner, but can utilize various different materials that are less expensive and/or have additional mechanical properties that provide further advantages. For example, the substrate can be a flexible material, such as a flex laminate, which are more economical. Further, the reduced area allows the substrate to be more easily mounted, for example, a self-adhesive flex laminate feature can be used as the adhesive provides sufficient bond strength for a smaller lighter flex laminate (as compare to a conventional PCB component).

FIGS. 5A-5B shows assembly of another chip device assembly 500. In this example, the assembly includes a streamlined chip 510 and flex PCB 530 mounted to a substrate 501. The probe contacts are electrically connected to the chip 510 by wire bonds 520 over which bond protection 540 is added.

In another aspect, the PCB on which probe contacts are provided can also be flex PCB. This lends itself to less expensive bonding methods such as TAB bonding techniques, which are generally cheaper and faster than wire bonding at very high volume production.

FIGS. 5C-5D show such an example chip device assembly 500' that includes a streamlined chip 510 and flex PCB 530 mounted to a substrate 500, with the probe contacts electrically connected to the chip 510 contacts by TAB bonding 522 over which bond protection 540 is added.

C. On-Chip Probe Electrical Contacts/Connections

In yet another aspect, an integrated, streamlined chip can be designed that uses probe contact pads defined in the chip itself. This approach utilizes an additional portion of the chip (on a same side as the active area) such that wire bonded connections through a PCB are avoided. This design avoids the necessity of a separate PCB component for the probe contacts and further avoids any bonding procedures and various workflow steps. In some embodiments, the chip can be manufactured on an alternative support substrate, such as any of those described herein. Advantageously, the chip can be manufactured without any separate support substrate, for example, the silicon wafer in which the chip is defined can act as the support. In such embodiments, a step of thinning the silicon wafer is unnecessary, thereby providing a more cost effective and streamlined fabrication as compared to conventionally packaged chip devices. In such embodiments, any available wafers can be used, for example wafers having a thickness of 925, 775, 725, 675, 625, or 525 um (thicknesses typically corresponding to wafer diameter). It is appreciated however that any suitable thickness wafer could be used.

This approach allows for an even more cost effective approach of eliminating the separate PCB entirely and thus any electrical bonding requirements to the chip. By putting the onus of making the electrical connections to the chip onto the instrument entirely, the need for a separate PCB, PCB Flex component, and wire or TAB bonds and protection can be completely eliminated. This allows for a design where the chip (e.g. bare silicon/MEMS device) can be mounted directly into an integral flowcell/chip carrier device. The elimination of the steps pertaining to the separate PCB and associated electrical connections save time and cost on the order of the cost of the chip itself. Typically, this approach prefers that the chip (e.g. silicon/MEMS device) has a reasonably low number of connections such that a sufficient area on the device can be allotted to the connections. This approach may incur some additional cost in regard to the additional area of silicon utilized for the contact connections, but for most chip designs, this increase in cost is significantly offset by the savings in the elimination of the separate PCB and associated reduction in workflow.

FIGS. 6A-6C show the assembly of an example chip device assembly 600 in accordance with the above approach. FIG. 6A shows the streamlined chip 610 having an active area 611 and a probe contact array 620 formed along one side of the same side. In this embodiment, chip 610 includes 12 pad single row contacts, although it is appreciated that fewer or more contact pads could be included. FIG. 6B shows assembly of the chip 610 within a chip carrier device 650 having an integrated flowcell. FIG. 6C shows chip 610 securely engaged within the chip carrier device 650 such that the active area is sealingly engaged with the integrated flowcell (not shown). As can be seen in FIG. 6C, the chip device 650 includes a window 652 through which the contact pad array 620 can be accessed by probes of an electrical interface of a module in which the chip device 650 is inserted. In this embodiment, the contact pads are fairly small (e.g. 12 pads at 0.8 mm pitch). Such a design would require rather precise and small instrument connection interface design to ensure the probes consistently and reliably engaged the corresponding contact pads.

Figures 7A, 7B, 7C:
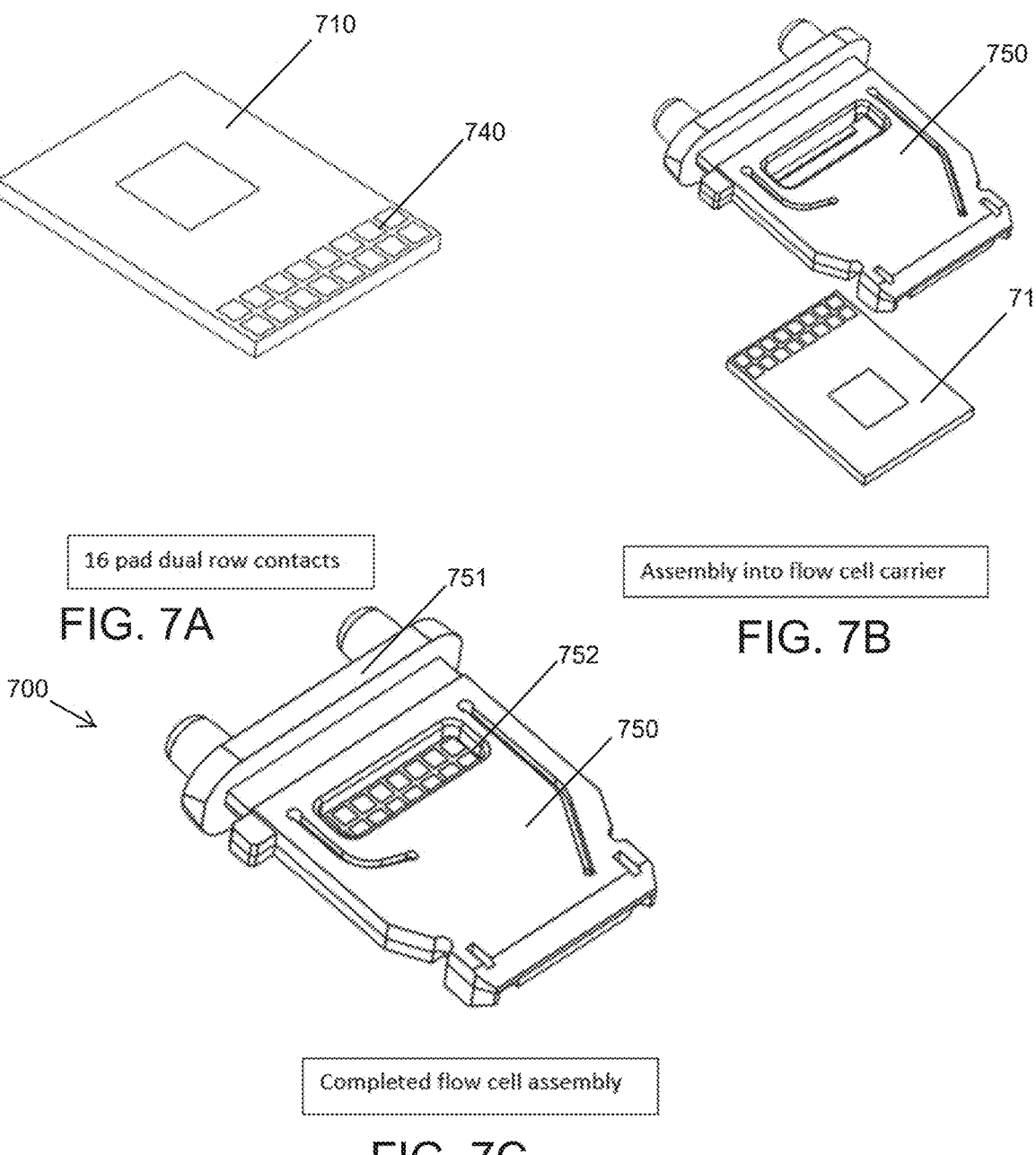
FIGS. 7A-7C illustrate methods of fabricating, assembling diagnostic chip devices, in accordance with some embodiments.

FIGS. 7A-7C show a substantially similar chip assembly 700, however, the chip 710 includes an integral probe contact array 740 defined in a dual row pad arrangement that sacrifices some additional area of the chip device to allow for sufficiently large number of pads, with each pad having sufficient area to make the instrument design significantly easier. In this embodiment, the spacing between the pads and arrangement of the pads allow use of a commonly available electrical contact arrangement (e.g. a 1.27 mm pitch, dual row, 16 pin pogo header). It is appreciated that the probe contact pads could be designed according to any dimension desired taking into account the available chip area. As in the previous embodiment, the chip 710 is secured within a chip carrier device 750 having a fluidic interface 751 and a window 752 through which the probe contact array 740 is accessible.

Figure 8:
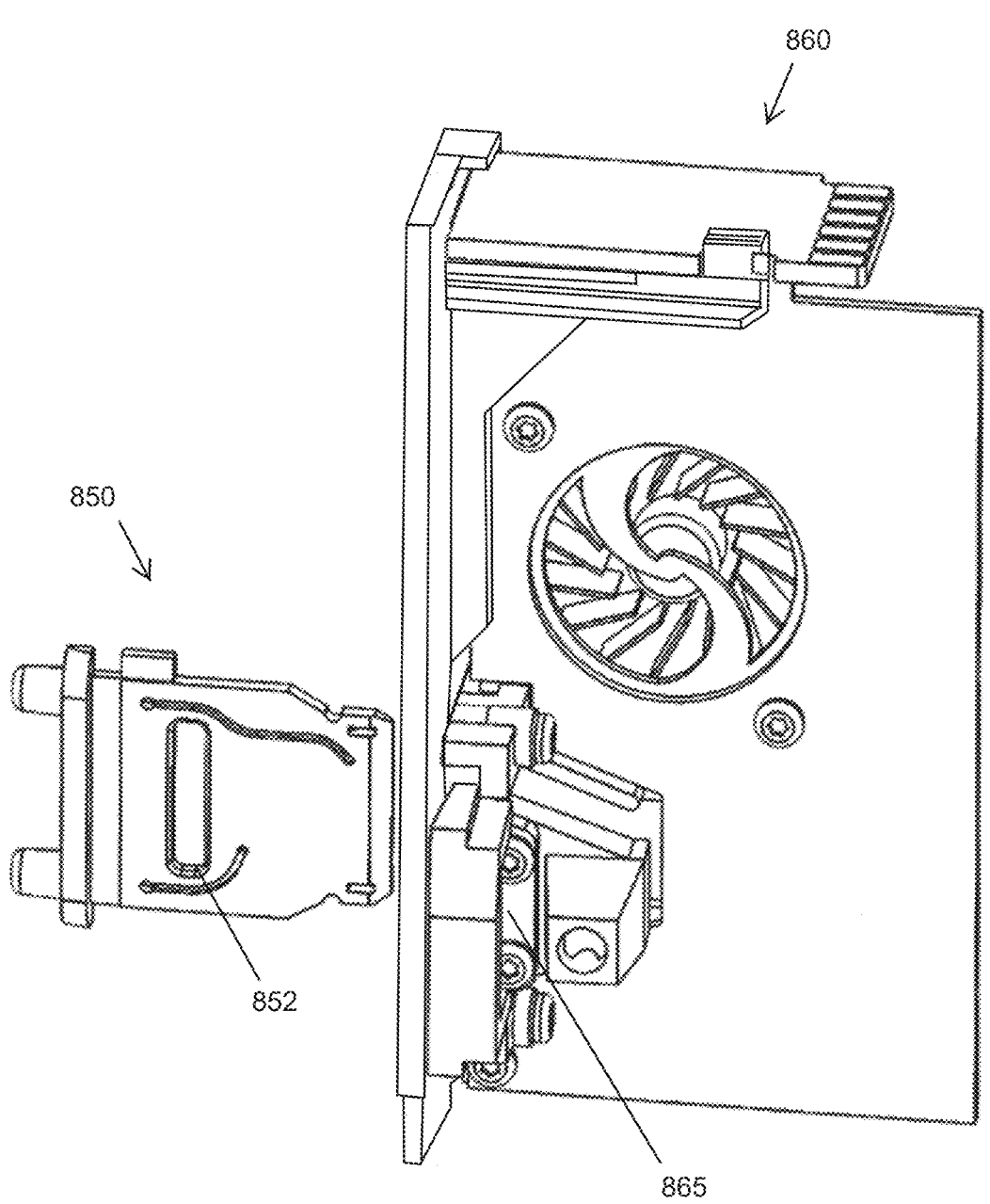
FIG. 8 illustrates a diagnostic chip device before and instrument interface, in accordance with some embodiments.

FIG. 8A shows a chip carrier device 850, in accordance with those described in FIGS. 6A-7C, before insertion into an instrument interface 860 of the module that includes a header 865 with probes (not visible) that engage corresponding on-chip contact pads exposed through window 852. The use and operation of the instrument interface with the chip is generally in accordance with the concepts discussed in the embodiments in FIGS. 1-3 and 8.

Figure 9B:
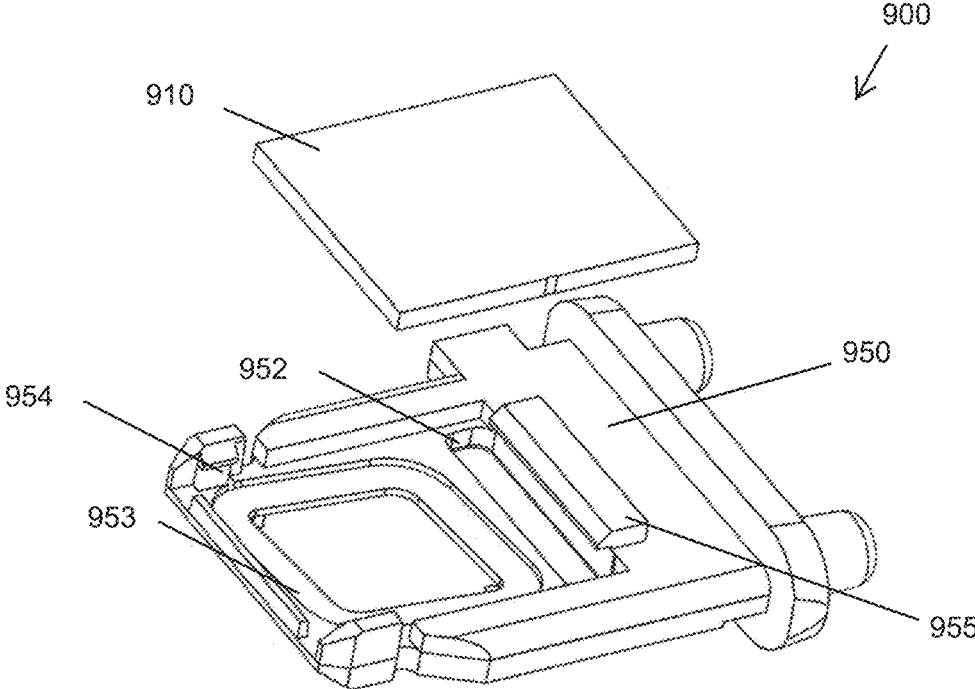
Figure 9C:
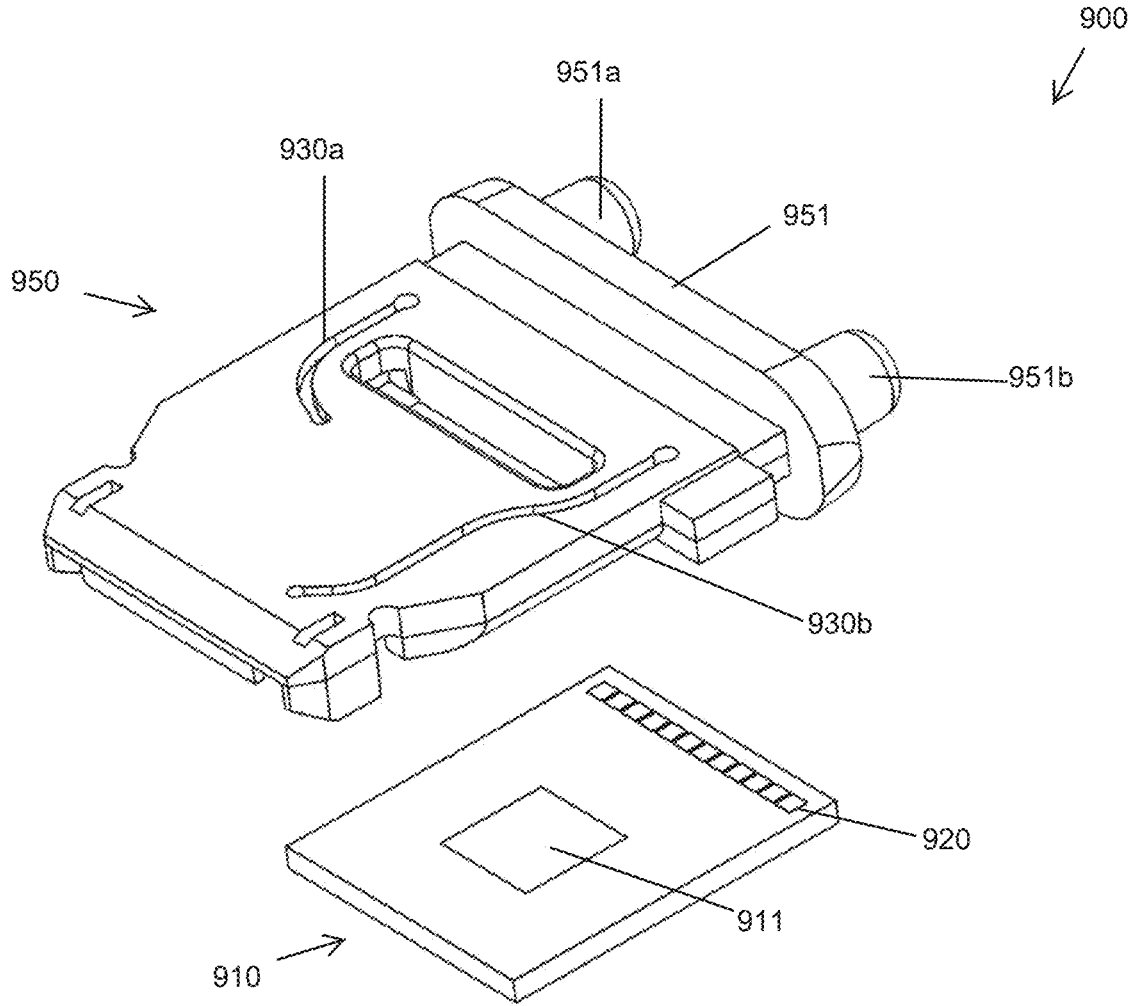

FIG. 9A-9C show detail views of a chip device assembly 900, in accordance with those described in FIGS. 6A-6C. FIG. 9A shows the chip carrier device 950 having an integrated flowcell chamber 953 in fluid communication with fluidic interface 951. The flowcell chamber is disposed within a recessed portion dimensioned to fittingly receive the chip 910 within so as to sealingly engage an active area of the chip against the flowcell chamber. The device can include a separate gasket to facilitate sealing or the gasket can be a raised portion defined within the device itself. In some embodiments, the chip carrier device 950 is formed as a unitary component and can be formed by injection molding or any suitable means. In other embodiments, the chip carrier device can be assembled by multiple components, for example, as in the previously described embodiments. The flowcell is filled with prepared fluid sample through flowcell inlet/outlet ports 953*a*, 953*b* in fluid communication with the inlet/outlet ports 951*a*, 951*b* of the fluidic interface 951.

As can be seen in the top view of FIG. 9B, the size and dimensions of the chip 951 corresponds to the recess in the chip carrier device 950. The chip carrier device 950 can include various retention or coupling features to secure chip 951 within, for example, retention tab 955 and snap-fit couplings 954 that are dimensioned and arranged to resiliently receive the chip and secure the chip with the active area sealingly engaged against the flowcell chamber. As can be seen in the underside view of FIG. 10, the integrated flowcell/chip carrier device 950 includes a flowcell inlet channel 930*a* in fluid communication with fluidic inlet 951*a* of fluidic interface 951 and a flowcell outlet channel 930*b* in fluid communication with 951*b* such that the sample cartridge and module to which the device is attached precisely controls the flow of fluid sample from the fluid sample cartridge into the flowcell chamber through the fluidic interface. The chip 910 includes an integrated probe contact pad array 920 on the chip surface on a same side as the active area 911, the array being positioned to be accessible through the probe contact window 952 of the integrated flowcell/chip carrier device 950.

In the foregoing specification, the invention is described with reference to specific embodiments thereof, but those skilled in the art will recognize that the invention is not limited thereto. Various features, embodiments and aspects of the above-described invention can be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A method of fabricating a diagnostic detection chip for use within a diagnostic chip device assembly, the method comprising:
   - forming an active surface on one side of a diagnostic detection chip, wherein the active surface includes one or more biologically sensitive optical detectors configured to detect the presence of one or more analyte in a fluid sample;
   - forming a plurality of probe contact pads on the same one side as the active surface;
   - electrically connecting the active surface to the plurality of probe contact pads of an electrical interface defined within the diagnostic detection chip without any wire bonds, and
   - securing the diagnostic detection chip to a thermally conductive metal substrate to facilitate thermal cycling of the fluid sample.

2. The method of claim 1, wherein the diagnostic detection chip comprises any of CMOS, ISFET, bulk acoustic, non-bulk acoustic, piezo-acoustic and pore array sensor chips.

3. The method of claim 1, wherein each of the plurality of probe contact pads are electrically connected to a plurality of electrical contacts defined on the diagnostic detection chip along the same side as the active surface.

4. The method of claim 1, wherein the diagnostic detection chip is without any rigid support substrate separate from a silicon wafer in which the diagnostic detection chip is defined.

5. The method of claim 1, wherein the plurality of probe contact pads are defined within the diagnostic detection chip itself.

6. The method of claim 5, wherein the plurality of probe contact pads are defined along the same side of the diagnostic detection chip as the active surface.

7. The method of claim 5, wherein the plurality of probe contact pads are arranged within one or more rows along or near one edge of the diagnostic detection chip.

8. The method of claim 1, further comprising:
   - securing the diagnostic detection chip within a diagnostic chip carrier so as to sealingly engage the active face of the diagnostic detection chip within a flowcell chamber of the diagnostic chip carrier.

9. The method of claim 8, wherein the diagnostic detection chip is positioned such that the probe contacts pads are accessible through a window of the diagnostic chip carrier.

10. The method of claim 1, wherein the thermally conductive metal substrate is copper.

11. The method of claim 1, wherein the diagnostic detection chip is defined to be operable without requiring any via connections through any rigid PCB support substrate underlying substantially the entire diagnostic detection chip.

* * * * *